United States Patent
Kitada et al.

(10) Patent No.: US 7,329,952 B2
(45) Date of Patent: Feb. 12, 2008

(54) METHOD OF FABRICATING A SEMICONDUCTOR DEVICE

(75) Inventors: Hideki Kitada, Kawasaki (JP); Noriyoshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 114 days.

(21) Appl. No.: 10/921,191

(22) Filed: Aug. 19, 2004

(65) Prior Publication Data

US 2005/0233564 A1   Oct. 20, 2005

(30) Foreign Application Priority Data

Apr. 16, 2004   (JP) .............................. 2004-121428

(51) Int. Cl.
*H01L 23/52* (2006.01)
(52) U.S. Cl. ............... 257/751; 257/762; 257/773; 257/E23.151; 257/E23.161
(58) Field of Classification Search ........... 257/741, 257/752, 762, 773, E23.151, E23.152, E23.161
See application file for complete search history.

(56) References Cited

U.S. PATENT DOCUMENTS 6,849,946 B2 *  2/2005  Sethuraman et al. ........ 257/752
6,888,250 B2 *  5/2005  Mori et al. .................. 257/773

OTHER PUBLICATIONS

M. Georgiadou et al., "Simulation of Shaped Evolution during Electrodeposition of Copper in the Presence of Additive", Journal Electrochemical Society, vol. 148, No. 1, pp. C54-C58, 2001.
S. Soukane et al., "Feature Superfilling in Copper Electrochemical Deposition", Journal Electrochemical Society, vol. 149, pp. C74-C81, 2002.

* cited by examiner

*Primary Examiner*—Matthew E. Warren
(74) *Attorney, Agent, or Firm*—Westerman, Hattori, Daniels & Adrian, LLP.

(57) ABSTRACT

The semiconductor device comprises a copper interconnection 26*b* buried in an insulating film 16, and a dummy pattern for chemical mechanical polishing buried in the insulating film 16 near the copper interconnection 26*b*. The unit patterns 26*c* of the dummy pattern are formed in the density of 10-25%. Even in the case that the electrolytic plating solution for bottom up growth mechanism is used, the step on the surface of a copper film due to over-plating can be decreased, and the total plating thickness necessary to fill the interconnection trenches can be decreased.

4 Claims, 12 Drawing Sheets

METHOD OF FABRICATING A SEMICONDUCTOR DEVICE

CROSS-REFERENCE TO RELATED APPLICATIONS

This application is based upon and claims the benefit of priority from the prior Japanese Patent Application No. 2004-121428, filed on Apr. 16, 2004, the entire contents of which are incorporated herein by reference.

BACKGROUND OF THE INVENTION

The present invention relates to a semiconductor device and a method for fabricating the same, more specifically a semiconductor device including copper interconnections formed by damascene process and a method for fabricating the semiconductor device.

Recently, as an interconnection material of semiconductor devices, copper, which has low resistivity and high electromigration resistance, is noted. Conventionally, interconnections of the semiconductor devices have been formed by depositing interconnection materials and then patterning by photolithography and dry etching. However, it is difficult to dry etch copper, which generates no volatile products. Then, in forming copper interconnections, the so-called damascene process, in which trenches and/or holes are patterned in insulating films, and then interconnection materials are buried in the trenches and holes, is used.

As a method for burying copper in trench patterns and hole patterns, CVD method, sputtering and reflow method, electrolytic plating method, etc. are considered prospective. Among them, electrolytic plating method, which has low costs and high through-puts and has good characteristics of filling the trenches and holes, is recently dominant.

As the electrolytic plating method, because of the recent higher integration of LSIs, a new burying method using a growth mechanism called bottom up growth is proposed (refer to Reference 1 (M. Georgiadou, et al., "Simulation of Shaped Evolution during Electrodeposition of Copper in the Presence of Additive", J. Electrochem. Soc., Vol. 148, pp. C54-C58, 2001) and Reference 2 (S. Soukane, et al., "Feature Superfilling in Copper Electrochemical Deposition", J. Electrochem. Soc., Vol. 149, pp. C74-C81, 2002)). The bottom up growth has a characteristic that the film grows preferentially on the bottom surfaces of trenches and holes, although in the conventional conformal growth, the film uniformly grows at the side walls and the bottom surfaces of the trenches and holes. Accordingly, the bottom up growth has lower probability of voids and seams remaining in trenches and holes than the conformal growth, and can fill the trenches and holes of higher aspect ratios.

SUMMARY OF THE INVENTION

When copper is grown by the bottom up growth mechanism, the phenomena that the grown copper film rises over trenches and hole patterns due to the higher growth rate in the trenches and holes and becomes thicker than in the flat part (over-plating phenomena) takes place (FIG. 12C). The over-plating phenomena is conspicuous especially in narrow trench patterns and hole patterns, and in wider trench patterns and hole patterns, the filling rate becomes low. Accordingly, in order to completely fill the wide trench patterns and hole patterns, the total deposition film thickness must be increased.

The step between a narrow trench/hole pattern region and a wide trench/hole pattern region becomes large, which makes the polish impossible. That is, when the polishing amount is set for a thickest film thickness, the film in the small film thickness region, such as the wide trench and hole pattern region, is excessively polished, and dishing often takes place.

According to one aspect of the present invention, there is provided a method for fabricating a semiconductor device comprising the steps of: forming in an insulating film an interconnection trench for burying an interconnection, and a plurality of trenches for burying a dummy pattern for chemical mechanical polishing arranged near the interconnection trench; forming by electrolytic plating a copper film over the insulating film with the interconnection trench and the plurality of trenches formed in; and removing the copper film on the insulating film by chemical mechanical polishing to form a copper interconnection buried in the interconnection trench, and the dummy pattern buried in the plurality of trenches, in the step of forming the interconnection trench and the plurality of trenches, the plurality of trenches being formed in a density of 10-25% of an area of the dummy region.

According to another aspect of the present invention, there is provided a semiconductor device comprising: a copper interconnection buried in an insulating film, and a dummy pattern for chemical mechanical polishing buried in the insulating film near the copper interconnection, in which unit patterns forming the dummy pattern are formed in a density of 10-25% of an area of the dummy region.

According to the present invention, the size and the density of dummy patterns for CMP are suitably controlled, whereby even a copper film is formed by bottom up growth mechanism, steps on the surface of the copper film can be decreased. The total plating film thickness necessary to fill trenches and holes can be thin. Thus, the throughput of semiconductor device fabrication can be improved, and the fabrication cost can be decreased.

DETAILED DESCRIPTION OF THE INVENTION

The detailed growth mechanism of the bottom up growth is not clear, but factors for generating the high growth selectivity depending on the location will be additives contained in the electrolytic plating solution and their compositions. The typical additives are a brightener and an inhibitor. The former has the effects of lowering the polarization at the cathode surface to enhance growth of new crystal nuclei and also increasing the deposition rates. The latter has the effects of enhancing the polarization at the cathode surface to suppress the growth.

Then, the growth mechanism of the bottom up growth will be explained with reference to FIGS. 12A-12C.

Figure 12A:
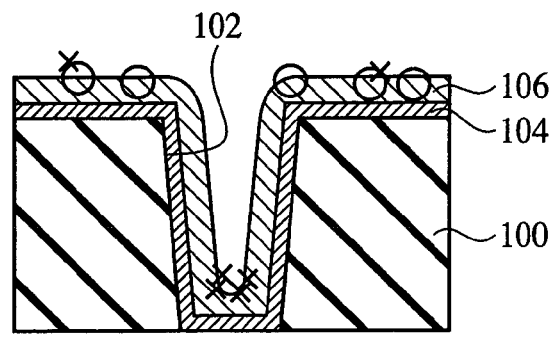
FIGS. 12A-12C are views explaining the burying mechanism of the bottom up growth.
Figure 12B:
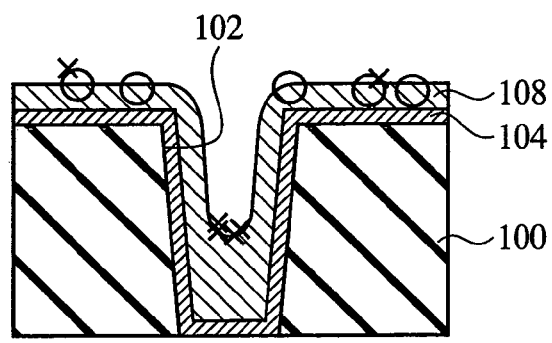
Figure 12C:
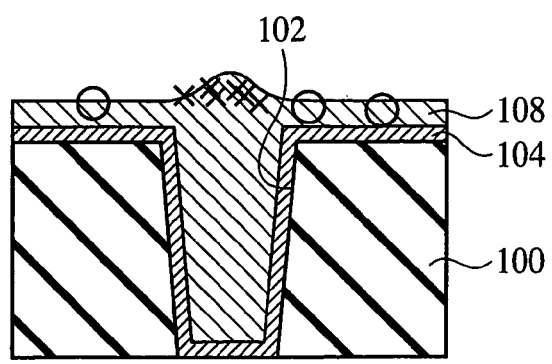

As illustrated in FIG. 12A, a substrate having a barrier metal 104 and a seed layer 16 formed on an insulating film 100 with a trench 102 formed in is immersed in an electrolytic plating solution to expose the surface of the seed layer 106 to the brightener (indicated by "x" in FIGS. 12A-12C) and the inhibitor (indicated by "o" in FIGS. 12A-12C) which are additives of the electrolytic plating solution.

At this time, the brightener intrudes into the trench 102, but the inhibitor cannot intrude into the small trench 102 because of their large molecular size and the properties. Resultantly, the brightener dominantly acts in the trench 102. As described above, the brightener has the effect of enhancing the deposition. The deposition inside the trench 102 is improved, and the growth of the copper film 108 starts at the bottom of the trench 102 preferentially to the flat region (FIG. 12B).

The probability of voids and seams remaining inside the trench 102 is thus decreased, and the trench 102 of higher aspect ratio can be filled.

The semiconductor device and the method for fabricating the same according to one embodiment of the present invention will be explained with reference to FIGS. 1A to 11C.

Figure 1A:
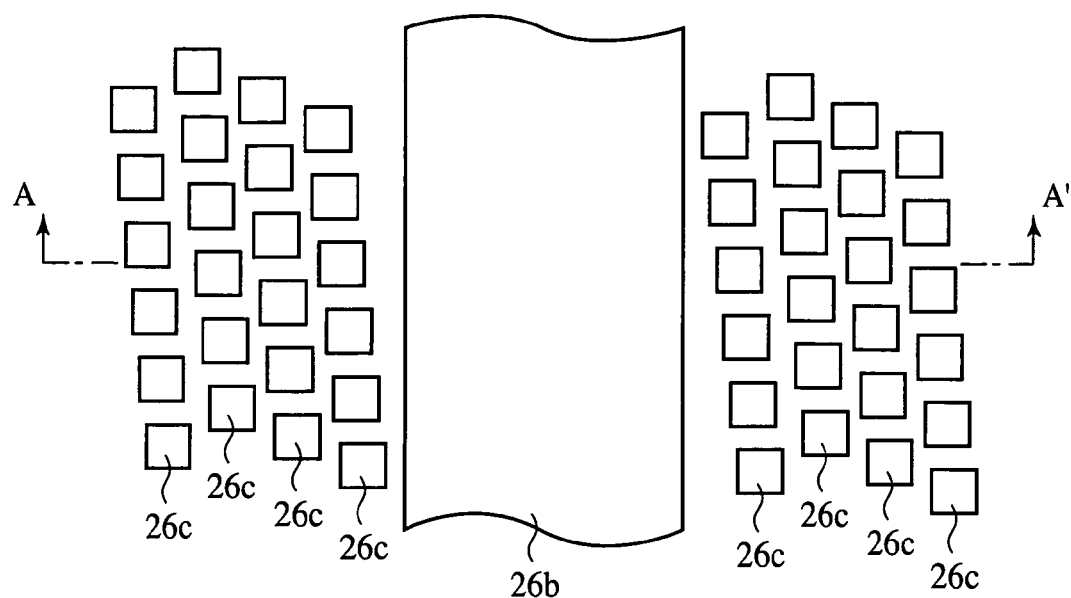
FIG. 1A is a plan view of the semiconductor device according to one embodiment of the present invention, which illustrates a structure thereof.
Figure 1B:
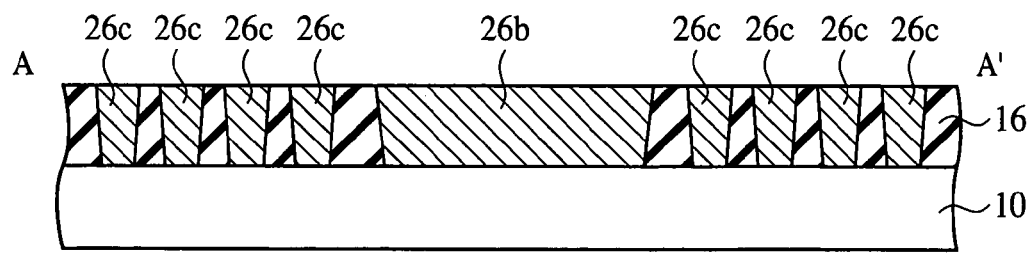
FIG. 1B is a diagrammatic sectional view of the semiconductor device according to the embodiment of the present invention, which illustrates the structure thereof.
Figure 3:
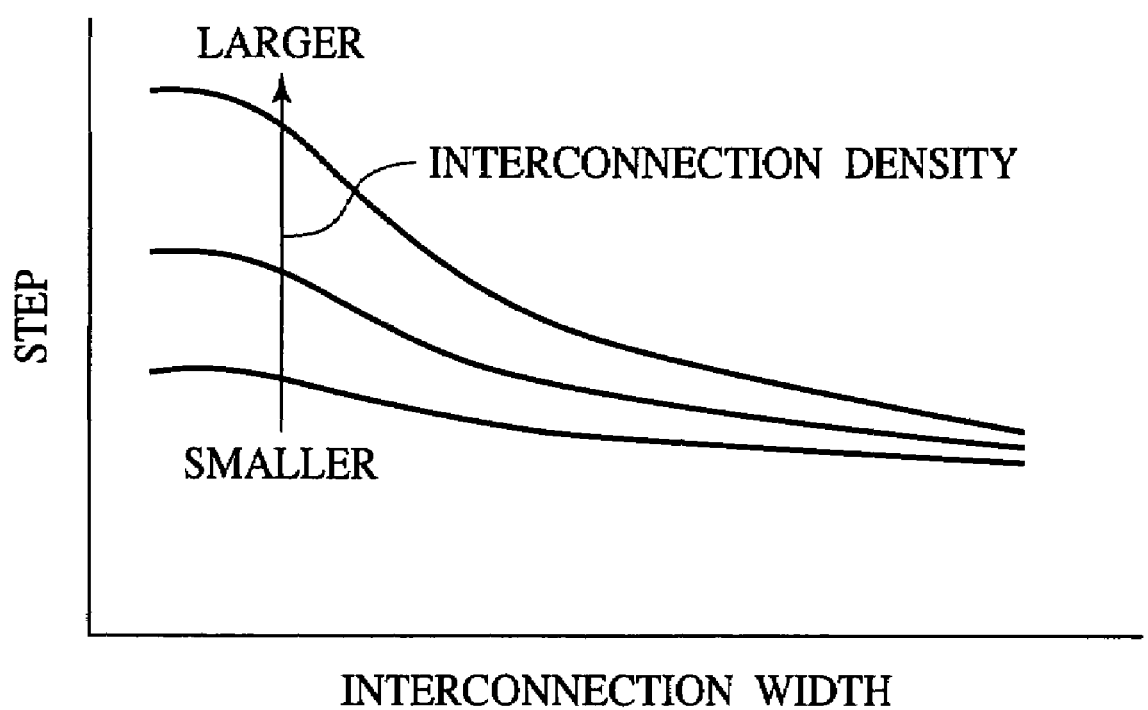
FIG. 3 is a graph of relationships between steps on the surface of the Cu film and interconnection widths.
Figure 4:
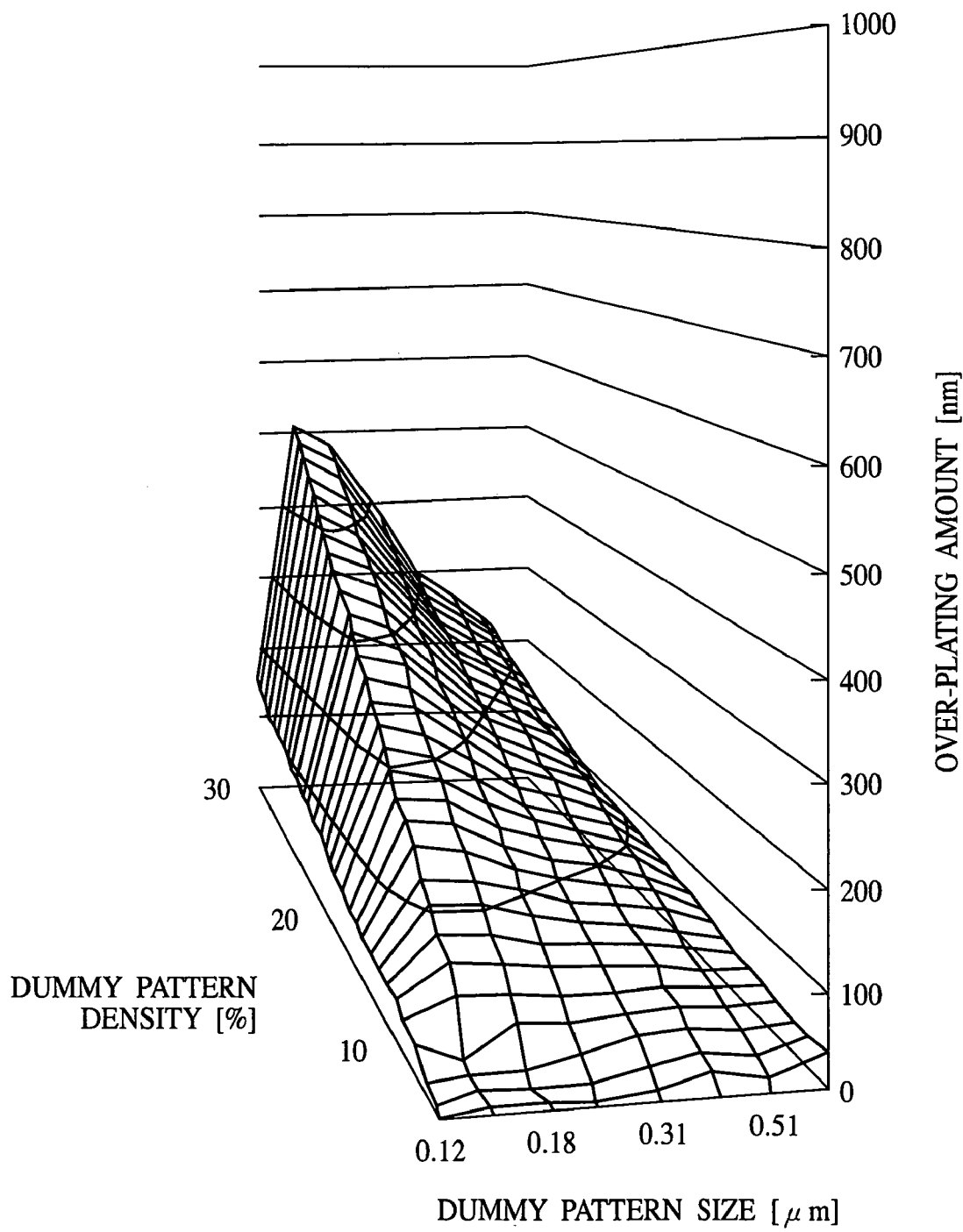
FIG. 4 is a graph of relationships between the over-plating amount, and the size and the density of the dummy patterns.
Figure 5:
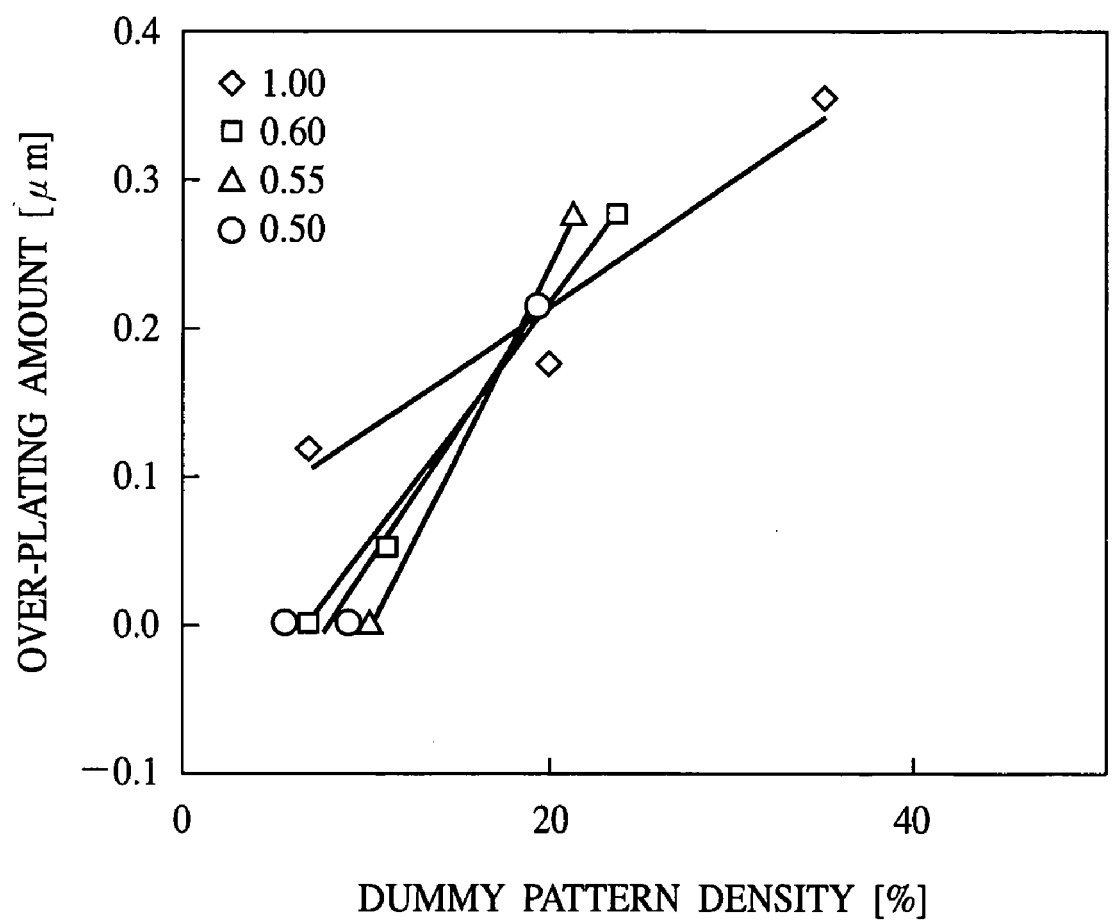
FIG. 5 is a graph of relationships between the over-plating amount, and the density of the dummy patterns.
Figure 6:
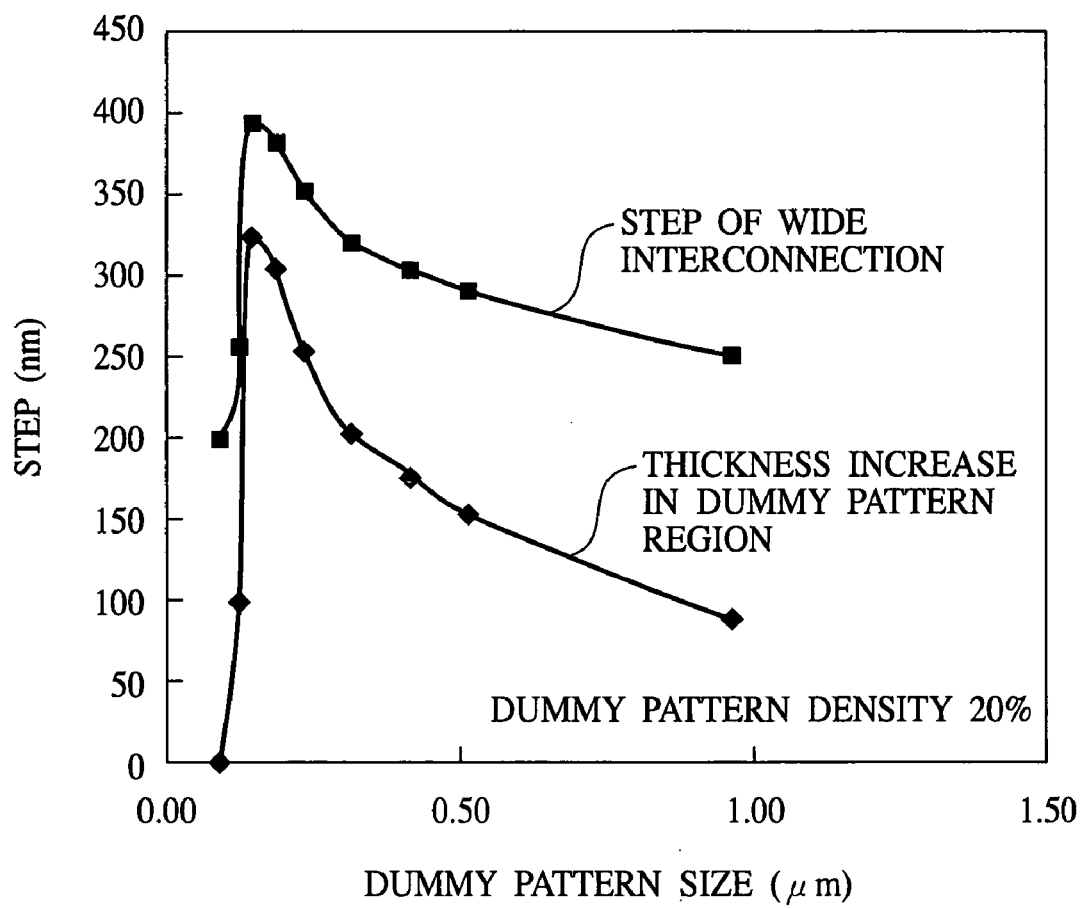
FIG. 6 is a graph of the dependency of the step on the wide interconnection region and film thickness increase in the dummy regions on the size of the dummy patterns.
Figure 7:
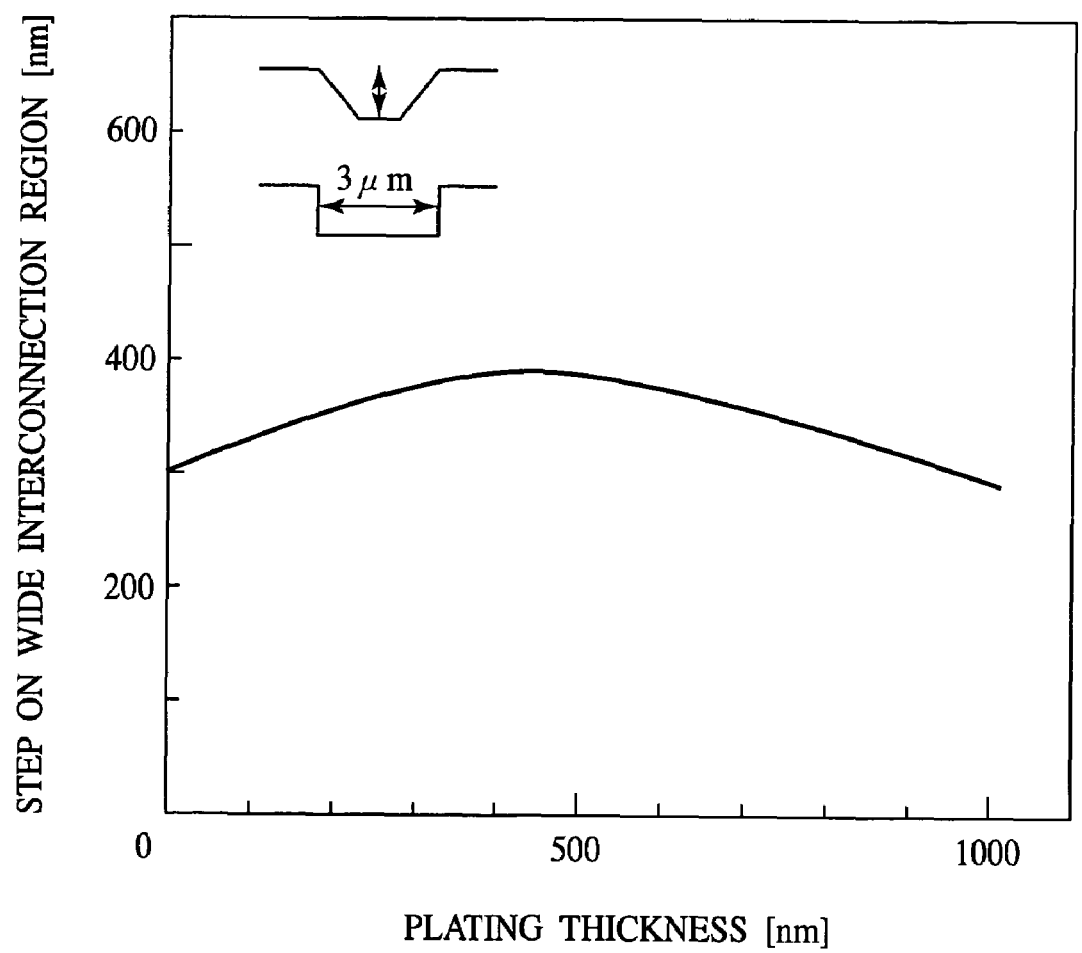
FIG. 7 is a graph of relationships between the steps on the wide interconnection region and the plating thickness.
Figure 8:
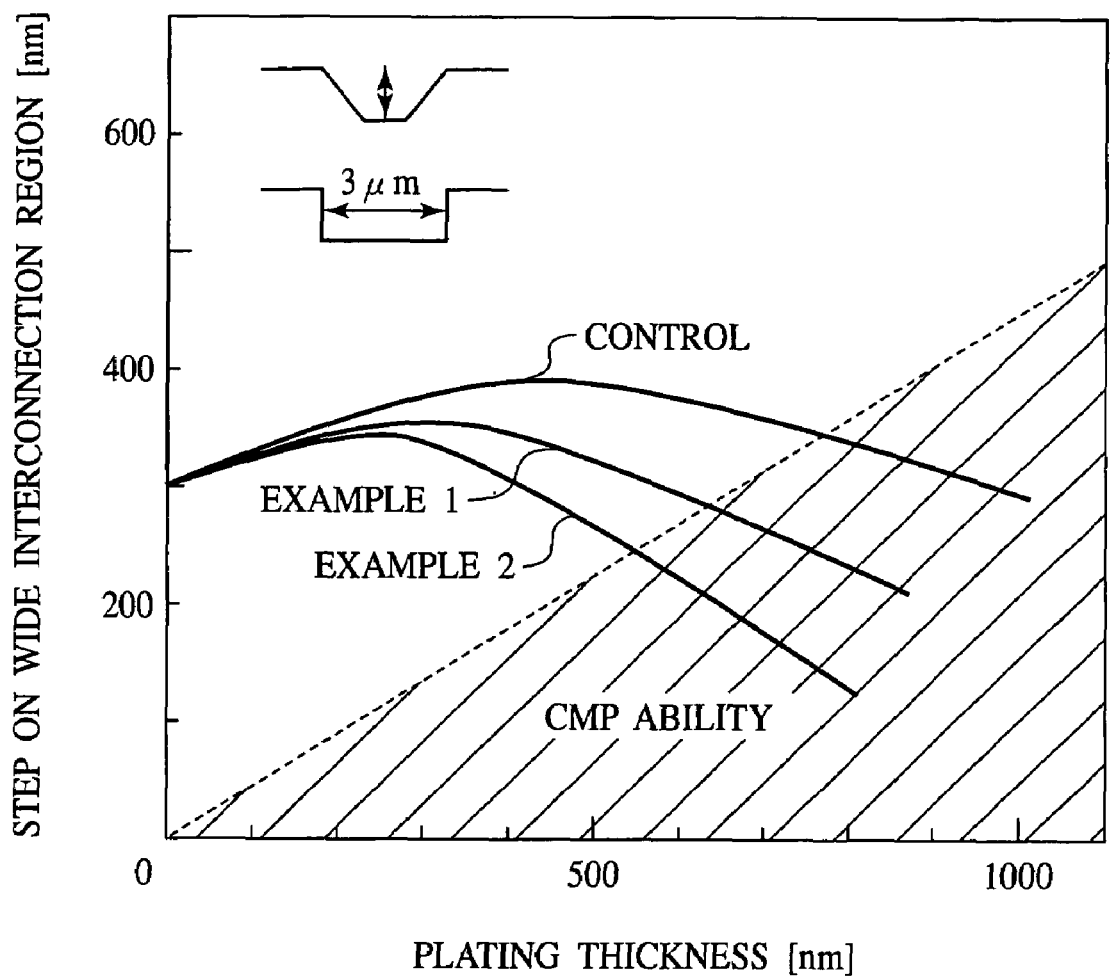
FIG. 8 is a graph of relationships between the step on the wide interconnection region and the plating thickness.
Figure 9:
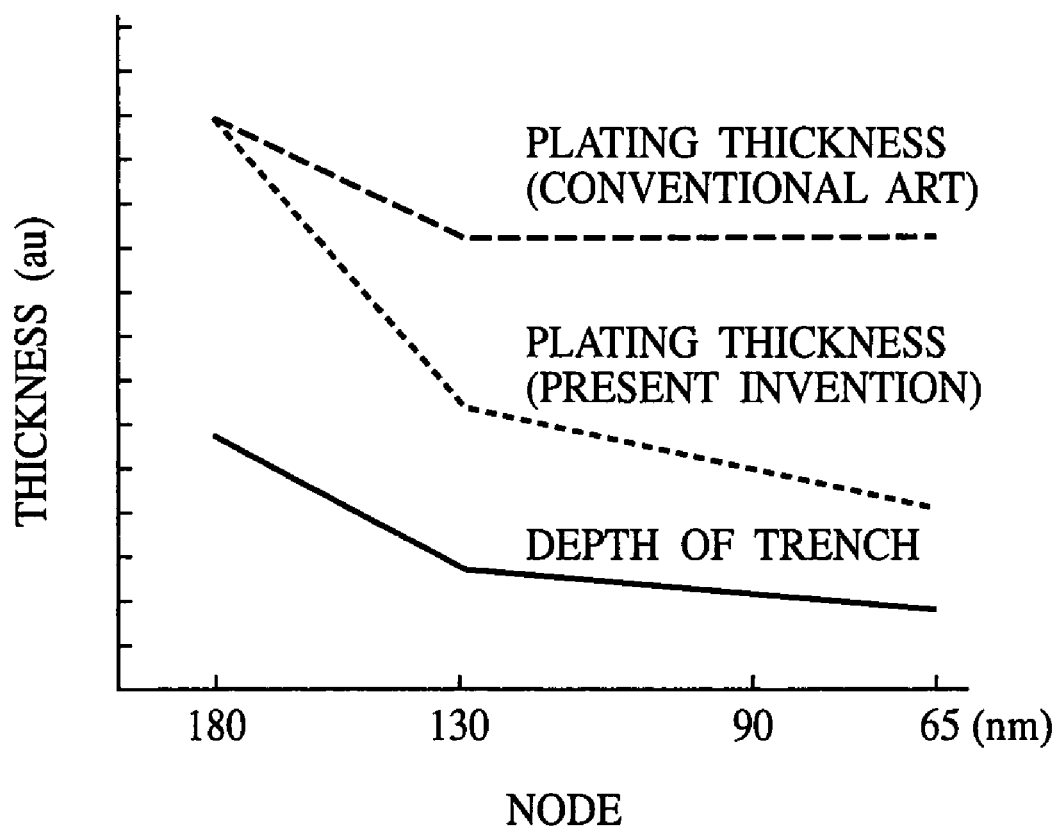
FIG. 9 is a graph of one example of relationships between nodes and the total plating thickness.

FIG. 1A is a plan view of the semiconductor device according to one embodiment of the present invention, which illustrates a structure thereof. FIG. 1B is a diagrammatic sectional view of the semiconductor device according to the embodiment of the present invention, which illustrates the structure thereof. FIGS. 2A-2D are views explaining the burying mechanism of the bottom up growth. FIG. 3 is a graph of relationships between steps on the Cu film surface and interconnection widths. FIG. 4 is a graph of relationships between over-plating amounts, and sizes and densities of dummy patterns. FIG. 5 is a graph of the relationships between over-plating amounts and dummy pattern densities. FIG. 6 is a graph of the dependency of dummy pattern sizes on steps of wide interconnection region and film thickness increases of dummy regions. FIGS. 7 and 8 are graphs of the relationships between the steps on the wide interconnection region and plating thicknesses. FIG. 9 is a graph of one example of relationships between nodes and total plating thicknesses. FIGS. 10 and 11 are sectional views of the semiconductor device according to the embodiment in the steps of the method for fabricating the same.

First, the structure of the semiconductor device according to the present embodiment will be explained with reference to FIGS. 1A and 1B.

An insulating film 16 is formed on a substrate 10. In this specification, the substrate means a semiconductor substrate itself but also the semiconductor substrate having elements, such as transistors, etc. and interconnection layers formed thereon.

A wide interconnection 26b is buried in an insulating film 16, and dummy patterns 26c are buried in the insulating film 16 near the wide interconnection 26b.

In this specification, the wide interconnection means an interconnection or an electrode whose width does not permit the preferential growth in trenches and holes when an electrolytic plating solution which causes the bottom up growth is used. In the electrolytic plating solution used by the inventors of the present application, for example, an interconnection having a width of not less than 1.0 μm is included in the wide interconnection. Such interconnections include the usual interconnections used in circuits of semiconductor devices, inductor, pads, guard rings, etc.

The dummy patterns are dummy patterns for Chemical Mechanical Polishing (CMP) and are arranged to improve the intra-pane uniformity of a pattern density in the CMP process for forming an interconnection layer by damascene process so as to decrease the intra-plane disuniformity of the polishing amount, e.g., dishing due to over polishing of copper, erosion due to over polishing of the insulating film, etc.

The semiconductor device according to the present embodiment is characterized mainly in that the width of the dummy patterns 26c near the wide interconnection 26b is not more than 80% or not less than 170% of a peak value of the over plating, in other words, not more than 80% or not less than 170% of a minimum interconnection width, and the density of the dummy patterns 26c is in the range of 10-25% of an area of the dummy region. The size and the density of the dummy patterns 26c are thus set, whereby the steps on the region for the wide interconnection 26b formed in can be much decreased.

Next, the reason for thus setting the size and the density of the dummy patterns will be explained.

Figure 2A:
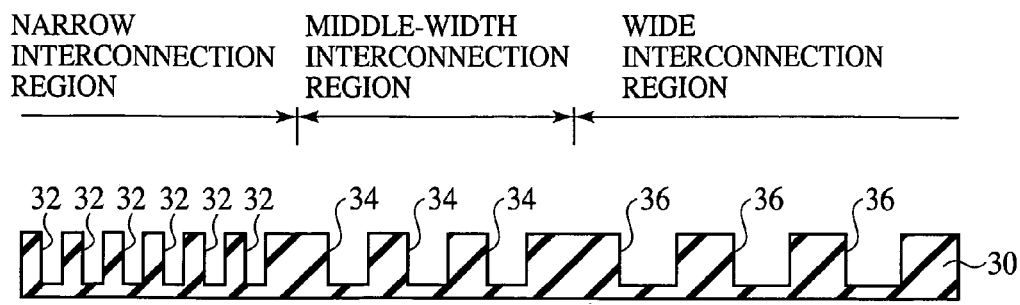
FIGS. 2A-2D are views explaining the burying mechanism of the bottom up growth.

Here is used a case that, as illustrated in FIG. 2A, a copper (Cu) film is grown by electrolytic plating on an insulating film 30 with interconnection trenches 32 for narrow interconnections, interconnection trenches 34 for intermediate width interconnections, and interconnection trenches 36 for wide interconnections formed in.

Figure 2B:
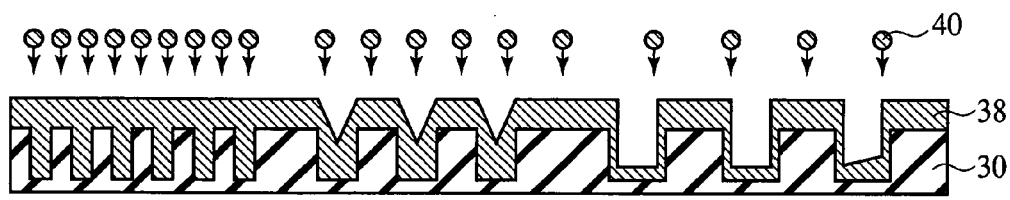

With an electrolytic plating solution which causes the bottom up growth, the copper (Cu) film is grown first preferentially on the bottom surfaces of the interconnection trenches 32 for the narrow interconnections. This is because, as illustrated in FIG. 12A, the inhibitor contained in the electrolytic plating solution cannot intrude into the interconnection trenches 32, but the brightener contained in the electrolytic plating solution can intrude into the interconnection trenches 32, whereby the copper atoms 40 are supplied preferentially to the bottoms of the interconnection trenches 32, and the preferential growth takes place there (FIG. 2B). On the other hand, the inhibitor can intrude into the interconnection trenches 34 and the interconnection trenches 36, and the inhibitor and the brightener cancel the mutual effects, resultantly causing substantially the conformal growth. This tendency takes place irrespective of generations of semiconductor devices, because usually, species and components of the additives are adjusted for every generation of semiconductor devices so that good small pattern burying characteristics can be obtained.

Figure 2C:
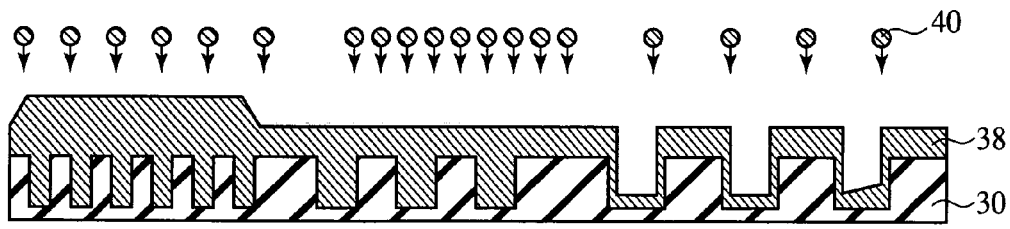

When the interconnection trenches 32 for the narrow interconnections are buried, copper atoms 40, which have been supplied to the narrow interconnection region, are partially supplied to the middle width interconnection region, and the growth of the Cu film 38 in these regions is enhanced. In the narrow interconnection region, the formed Cu film 38 is risen over the interconnection trenches 32 (over-plating) by the higher growth rate at the parts of the interconnection trenches 32 and is thicker than in the middle width interconnection region and the wide interconnection region (FIG. 2C).

Figure 2D:
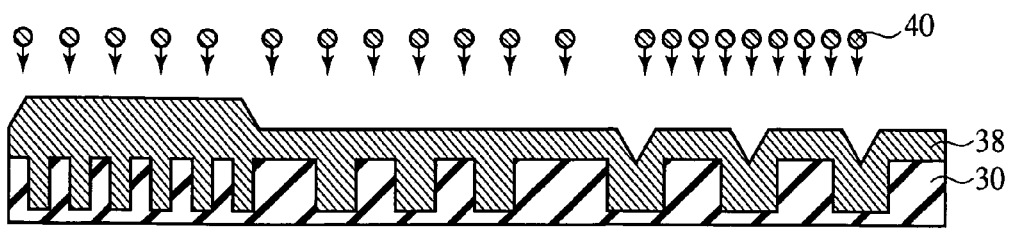

When the interconnection trenches 34 for the middle width interconnections are buried, copper atoms 40, which have been supplied to the middle width interconnection region, are partially supplied to the wide interconnection region. Then, the Cu film 38 is grown in conformal and the interconnection trenches 36 for the wide interconnection are buried. In the middle width interconnection region, the formed Cu film 38 is risen over the interconnection trenches 34 by the higher growth rate at the parts of the interconnection trenches 34 and is thicker than in the wide interconnection region (FIG. 2D).

The electrolytic plating using an electrolytic plating solution causing the bottom up growth, which has the above-described growth manner, makes the film thickness of the deposited Cu film larger in the narrower trench regions and higher density regions. Accordingly, the steps on the Cu film surface formed by the over-plating are larger as the interconnection width is smaller, and the interconnection density is higher.

As described above, in the bottom up growth mechanism, the copper goes on growing from the narrow patterns to the wide patterns, and the steps on the wide interconnection region is closely related with the copper volume percentage of the adjacent patterns which are easily preferentially grown. That is, the supply of the copper to the wide interconnection region is decreased by a copper supply required for the growth in the adjacent narrow interconnection region and the middle width interconnection region.

Then, in the present invention, the size and the density of patterns provided near the wide interconnection region, patterns other than those of the major interconnections, which are less influential to the major functions of the semiconductor device and the design rules, more specifically, dummy patterns for CMP are changed to thereby make the copper volume in the dummy regions smaller so as to use the copper volume in growing the wide interconnections. Conventionally, although the interconnection rules are changed, the rules of the dummy patterns are never changed.

FIG. 4 is a graph of relationships between the over-plating amount, and the size and the density of the dummy patterns. In this measurement, the unit pattern forming the dummy patterns was square. For the electrolytic plating, a jet plating system was used, and a copper sulfate bath was used. The additives of the electrolytic plating solution were an inhibitor, a brightener and a smoother. As a DC electrolytic plating condition, the current steps were sequentially changed for the growth in the range of a 10-60 mA/cm$^2$ range.

As shown in the graph, the over-plating amount is larger as the density of the dummy patterns is higher, and is maximum when the size of the dummy pattern is about 0.15 μm. The over-plating amount is much dependent on the size of the dummy patterns, and the size of the dummy patterns is set to be a value which is not more than 80% or not less than 170% of a width at which the over-plating has a peak value, whereby the value of the over-plating amount can be decreased to a half the peak value, or less. This tendency was substantially the same even when the electrolytic plating condition was changed.

A width at which the over-plating amount has a peak value varies depending on compositions, etc. of the electrolytic plating solution. Usually, the electrolytic plating solution has the additive species and components adjusted for every generation of semiconductor devices so that the small pattern filling characteristics are good. Accordingly, a width at which the over-plating amount has a peak value will be usually approximate to a minimum interconnection width. Accordingly, a width at which the over-plating amount has a peak value can be a minimum interconnection width.

Based on the above, it will be desirable to set the width of the dummy patterns at a width which is not more than 80% or not less than 170% of a width at which the over-plating amount has a peak value. A minimum value of the size of the dummy patterns is a minimum processing dimension which can be patterned by the lithography of the generation. A maximum value of the size of the dummy patterns can be set, based on the dummy patterns' intrinsic function of preventing the dishing and erosion.

FIG. 5 is a graph of relationships between the over-plating amount and the density of the dummy patterns. In the graph, the ◇ marks indicate the case that the size of the dummy patterns is 1.0×1.0 μm; the □ marks indicate the case that the size of the dummy patterns is 0.6×0.6 μm; the △ marks indicate the case that the size of the dummy patterns is 0.55×0.55 μm; and the ○ marks indicate the case that the size of the dummy patterns is 0.5×0.5 μm.

As seen in the graph, the over-plating amount is larger as the density of the dummy patterns is higher irrespective of the size of the dummy patterns. Based on the result seen in FIG. 5 and the plan-view observation, etc. made by the inventors of the present application, it has been found that in the region where the density of the dummy patterns is not more than 25% of an area of the dummy region, the over-plating is decided by the over-plating amount in the discrete dummy patterns, but in the region where the density of the dummy patterns is more than 25%, the over-plating of adjacent dummy patterns are jointed with each other to thereby increase the over-plating amount.

On the other hand, when the density of the dummy patterns is less than 10% of an area of the dummy region, the dummy patterns' function of preventing the dishing and erosion cannot be easily attained.

Based on the above, it will be desirable that the density of the dummy patterns is set at not less than 10% and not more than 25% of an area of the dummy region.

FIG. 6 is a graph of the dependency of the steps on the wide interconnection region and the film thickness increases (over-plating) in the dummy region on the sizes of the dummy patterns. In this measurement, the density of the dummy pattern is fixed at 20% of an area of the dummy region.

As seen in the graph, the size of the dummy patterns at which the steps of the wide interconnection region are maximum, and the size of the dummy patterns at which the over-plating amount in the dummy regions is maximum substantially agree with each other. This means that the over-plating in the dummy regions are closely related with the steps on the wide interconnection region. Accordingly, it can be seen that in order to decrease the steps on the wide interconnection region, it is effective to control the density and the size of the dummy patterns to thereby decrease the over-plating in the dummy regions.

It has the effect of decreasing the total plating thickness that the size and the density of the dummy patterns are set as described above to thereby decrease the over-plating. This will be explained below.

FIGS. 7 and 8 are graphs of relationships between the steps of the wide interconnection region and the plating thickness. In the measurement for FIGS. 7 and 8, the wide interconnections had a 200 nm-thick and a 3 μm-width. The dummy patterns had a 0.6×0.6 μm size and a 40% density of an area of the dummy region, which are conventional conditions.

As illustrated in FIG. 7, at the early stage of the growth, copper atoms are supplied preferentially to fill the dummy regions, and accordingly the steps of the wide interconnection region go on increasing as the plating thickness is increased. When the film thickness is large, the filling the dummy regions is completed, and copper atoms, which have been supplied to the dummy regions, are supplied preferentially to the wide interconnection region. Coupled with the effect of the smoother in the electrolytic plating solution, this reduces the steps on the wide interconnection region.

As seen in FIG. 7, in order to prevent the steps after the electrolytic plating of Cu film, it is effective to make the film thickness of the Cu film large. However, when the plating film is made thick, in the damascene method the sacrificial film to be removed by polishing is also thick. Resultantly, the increase of the plating thickness and the increase of the film thickness to be removed by the CMP cause the fabrication cost increase and material cost increase, and low throughputs.

FIG. 8 shows the case that dummy patterns of a 0.6×0.6 μm size are arranged in the density of 40% of an area of the dummy region (Control), the case that dummy patterns of a 0.6×0.6 μm size are arranged in the density of 20% of an area of the dummy region (Example 1), and the case that dummy patterns of a 0.8×0.8 μm size are arranged in a density of 20% of an area of the dummy region (Example 2). The dotted line indicates the ability of the CMP conditions the inventors of the present application have used in the examination. That is, it means that in order to flatten the surface of the Cu film without dishing, the relationship between the surface steps and a total plating thickness must be positioned in the region lower right of the dotted line. This condition is for the polishing rate of the flat portions being about 1.6 times the polishing rate of the steps.

In the Control, the total film thickness at the intersection between the curve and the dotted line is about 770 nm. Accordingly, to flatten the Cu film under the CMP condition indicated by the dotted line it is necessary to set the total film thickness at not less than 770 nm. In terms of the trench depth, to flatten the Cu film under the CMP conditions indicated by the dotted line, the total plating thickness which is larger by more than about 2.5 times the trench depth is necessary.

In Example 1, however, the total plating thickness at the intersection between the curve and the dotted line is about 630 nm. Accordingly, the plating thickness necessary to flatten the Cu film under the CMP condition indicated by the dotted line is about 630 nm, and the total plating thickness can be decreased by about 20% of the total plating thickness of the Control. This thickness corresponds to about 2.1 times the trench depth.

In Example 2, the total plating thickness at the intersection between the curve and the dotted line is about 550 nm. The total plating thickness necessary to flatten the Cu film under the CMP composition indicated by the dotted line is about 550 nm, and the total plating thickness can be decreased by about 40% of the total plating thickness of the Control. This thickness corresponds to about 1.8 times the trench depth.

As a standard for evaluating a step decrease by the plating, an initial step, i.e., a trench depth can be used. Under the CMP condition indicated by the dotted line in FIG. 8, the total plating thickness allowing for an initial step is about 690 nm and is about 2.3 times the initial step. In Examples 1 and 2, however, it can be seen that the total plating thickness smaller than 690 nm can realize steps smaller than the initial step and is effective to decrease the steps.

FIG. 9 is a graph of one example of the relationships between the nodes of the semiconductor devices and the total plating thickness.

As shown in FIG. 9, the depth of the trenches is decreased with the generations of the semiconductor devices. This is because the film thickness of the inter-layer insulating film is decreased while the nodes are decreased.

In the conventional structure, in the generation wherein the nodes are below about 130 nm, the trench depth is decreased, but the total plating thickness is not substantially changed. This is because while the burying efficiency is improved as devices are more downsized, the steps due to the over-plating is larger, which the substantial total plating thickness cannot be decreased for the prevention of the steps.

In the present invention, however, the size and the density of the dummy patterns are suitably set in accordance with an interconnection pattern size, which permits the total plating thickness to be thinned with the generations.

Next, the method for fabricating the semiconductor device according to the present embodiment will be explained with reference to FIGS. 10A-10D and 11A-11C. In the following embodiment, fabrication conditions corresponding to Example 1 shown in FIG. 8 will be used.

An inter-layer insulating film 12 of a silicon oxide film 12a and a silicon nitride film 12b is formed on the substrate 10. Narrow interconnections 14a and a wide interconnection 14b are buried in the inter-layer insulating film 12.

Figure 10A:
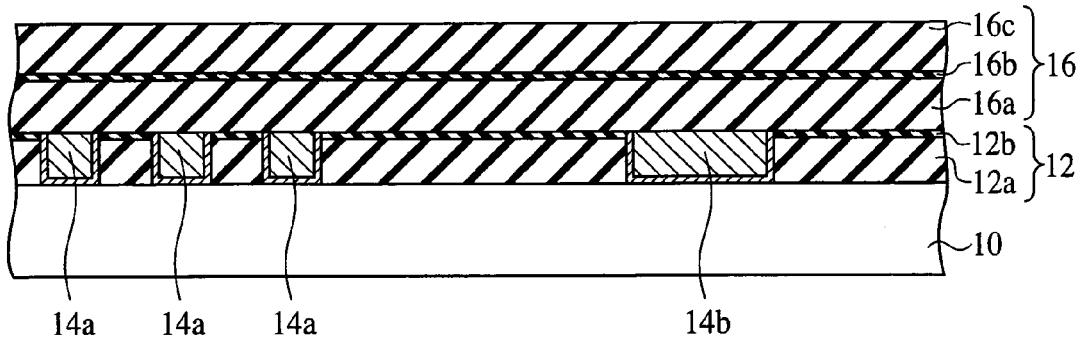
FIGS. 10A-10D and 11A-11C are sectional views of the semiconductor device according to the embodiment of the present invention in the steps of the method for fabricating the semiconductor device, which illustrate the method.

On the inter-layer insulating film 12, a silicon oxide film 16a of, e.g., a 200 nm-thick, a silicon nitride film 16b of, e.g., a 50 nm-thick and a silicon oxide film 16c of, e.g., a 300 nm-thick are deposited by, e.g., CVD method to form an inter-layer insulating film 16 of these films (FIG. 10A).

Figure 10B:
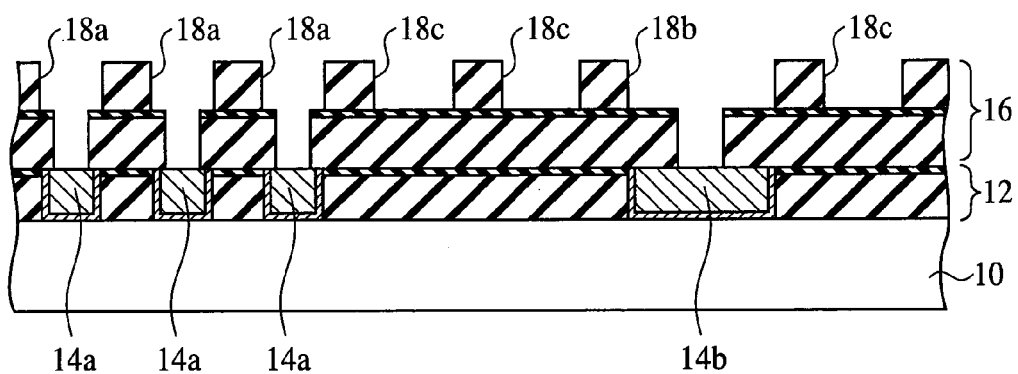

Then, interconnection trenches 18a for burying interconnections to be electrically connected to narrow interconnections 14a, interconnection trenches 18b for burying interconnections to be electrically connected to the wide interconnections 14b, and trenches 16c for burying dummy patterns are formed in the inter-layer insulating film 16a in the same way as in the usual dual damascene process (FIG. 10B). At this time, the width of the interconnection trenches 18a is, e.g., 0.15 μm, the width of the interconnection trenches 18b is, e.g., 3.0 μm, the size of the trenches 18c is, e.g., 0.6×0.6 μm, and the density of the trenches 18c is 20% of an area of the dummy region.

Figure 10C:
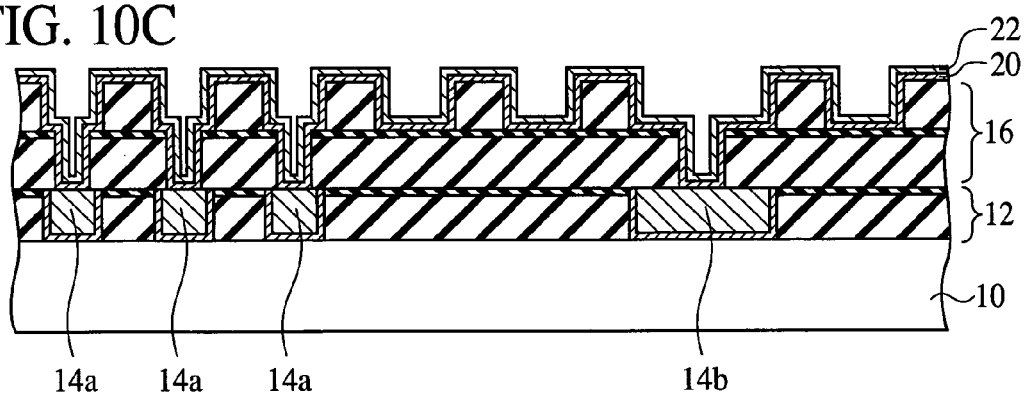
Figure 10D:
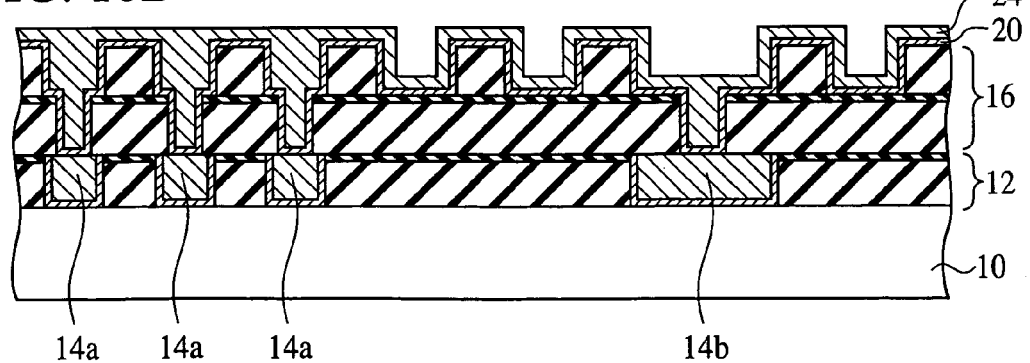

Then, a barrier metal 20 of, e.g., tantalumnitride (TaN), and a seed layer 22 of copper (Cu) are formed by, e.g., sputtering method (FIG. 10C).

Next, a Cu film 24 is formed by electrolytic plating using an electrolytic plating solution causing the bottom up growth mechanism with the seed layer 22 as the seed.

The growth of the Cu film 24 first goes on preferentially at the bottom surfaces of the interconnection trenches 18a for the narrow interconnections. This is because the inhibitor contained in the electrolytic plating solution cannot intrude into the interconnection trenches 18a, but the brightener contained in the electrolytic plating solution can intrude into the interconnection trenches 18a, whereby the growth takes place preferentially in the interconnection trenches 18a. On the other hand, the inhibitor can intrude into the interconnection trenches 18a and the trenches 18c and cancels the effect of the brightener. Resultantly, the growth which is approximate to the conformal growth is made.

When the interconnection trenches 18a are filled (FIG. 10D), copper atoms which have been supplied to the narrow interconnection region are partially supplied to the dummy region, and the growth of the Cu film 24 in the dummy region is enhanced. In the narrow interconnection region, the higher growth rate in the interconnection trenches 18a causes the Cu film 24 to be grown, rising over the interconnection trenches 18a, and the Cu film 24 is thicker than in the dummy region and the wide interconnection region.

Figure 11A:
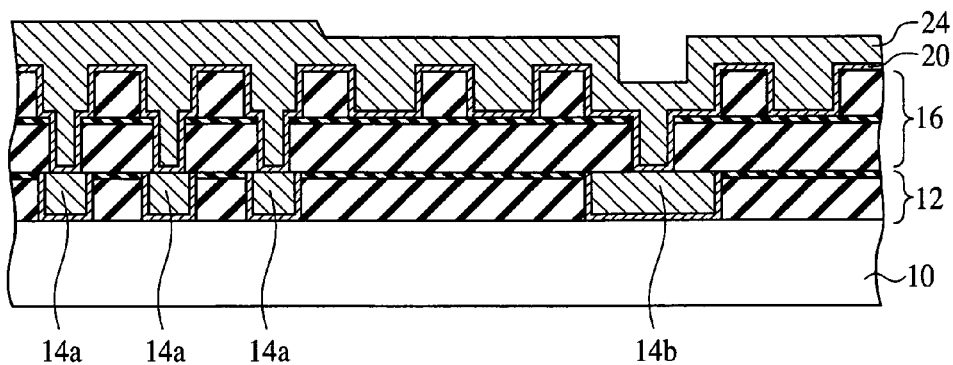
Figure 11B:
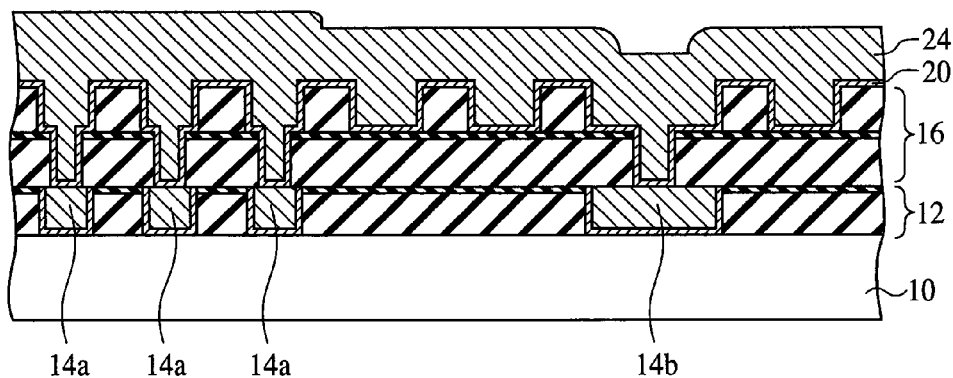

When the trenches 18c are buried (FIG. 11A), copper atoms which have been supplied to the dummy region are partially supplied to the Cu film 24 in the wide interconnection region. In the dummy region, the higher growth rate in the trenches 18c causes the Cu film 24 to be grown, rising over the trenches 18a, and the Cu film 24 is thicker than in the wide interconnection region (FIG. 11B).

Thus, the Cu film 24 of, e.g., a 630 nm-total plating thickness is formed. At this time, the size of the trenches 18c for the dummy patterns is, e.g., 0.6×0.6 μm, and the density of the dummy patterns is, e.g., 20% of an area of the dummy region, whereby the step between the wide interconnection region and the dummy region is decreased to, e.g. 280 nm. The Cu film 24 necessary to fill the interconnection trenches 18a, 18b and the trenches 18c can be as thin as 630 nm.

Figure 11C:
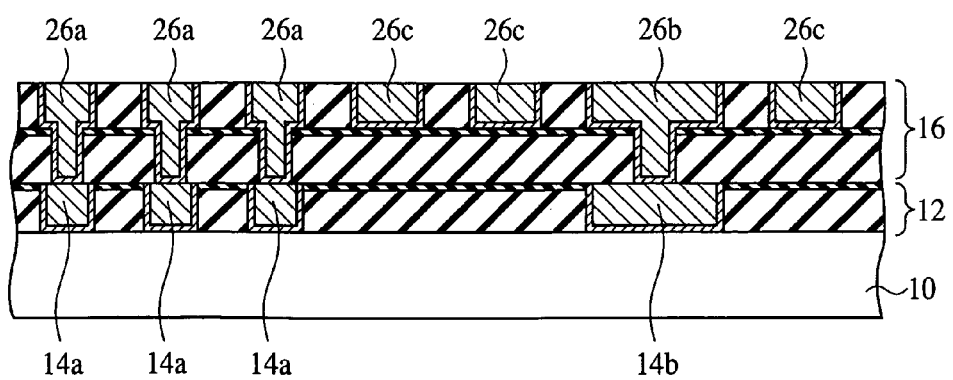

Then, the copper film 24c and the barrier metal 22 on the inter-layer insulating film 16 are removed by CMP method, and the narrow interconnections 26a buried in the interconnection trenches 18a, the wide interconnection 26b buried in the interconnection trench 18b and the dummy patterns 26c buried in the trenches 18c are formed (FIG. 11C).

At this time, the step between the wide interconnection region and the dummy region is as low as, e.g., 280 nm, whereby the narrow interconnections 26a, the wide interconnection 26b and the dummy patterns 26c can be easily formed while the dishing of the wide interconnections 26b can be suppressed.

As described above, according to the present embodiment, the size and the density of the dummy patterns for CMP are suitably controlled, whereby even when the copper film is grown by bottom up growth mechanism, the steps on the surface of the copper film can be decreased. The total plating thickness necessary to fill the trenches and holes can be thin. Accordingly, the throughput of semiconductor device fabrication can be increased, and the fabrication cost can be decreased.

Modified Embodiments

The present invention is not limited to the above-described embodiment and can cover other various modifications.

For example, in the above-described embodiment, the size and the density of the dummy patterns are controlled to decrease the step on the wide interconnection region. However, it is not necessary that the size and the density of all the dummy patterns present on a wafer are uniformly controlled. The dummy patterns which are much influential to the growth of the wide interconnections are those present within not more than 20 μm from the wide interconnections. Accordingly, the dummy patterns in the region within not more than about 20 μm from the wide interconnections may be controlled as in the above-described embodiment, and the dummy patterns in the rest region may have different sizes and densities.

In the above-described embodiment, the interconnections are formed by dual damascene process, but the present invention is applicable to forming interconnections by single damascene process.

What is claimed is:

1. A semiconductor device comprising:
   an insulating film having an interconnection region and a dummy region which is provided near the interconnection region;
   a copper interconnection buried in the insulating film in the interconnection region; and
   a plurality of dummy patterns for chemical mechanical polishing buried in the insulating film in the dummy region,
   the dummy patterns comprising 10-25% of an area of the dummy region,
   each of the dummy patterns has a width which is not more than 80% or not less than 170% of a width of a minimum-width copper interconnection buried in the insulating film.

2. A semiconductor device according to claim 1, wherein the copper interconnection and the dummy pattern are formed by electrolytic plating,
   each of the dummy patterns has a width which is not more than 80% or not less than 170% of a width at which an over-plating amount is maximum with an electrolytic plating solution used in forming the copper interconnection and the plurality of dummy patterns.

3. A semiconductor device according to claim 1, wherein the dummy patterns are formed in a region within 20μm from the copper interconnection.

4. A semiconductor device according to claim 1, wherein the copper interconnection has a width of not less than 1μm.

* * * * *

UNITED STATES PATENT AND TRADEMARK OFFICE
CERTIFICATE OF CORRECTION

| | | |
|---|---|---|
| PATENT NO. | : 7,329,952 B2 | Page 1 of 1 |
| APPLICATION NO. | : 10/921191 | |
| DATED | : February 12, 2008 | |
| INVENTOR(S) | : Hideki Kitada et al. | |

It is certified that error appears in the above-identified patent and that said Letters Patent is hereby corrected as shown below:

On the Title page, Item (54) and in the Specification, Lines 1 and 2 of Column 1
Change

"METHOD OF FABRICATING A SEMICONDUCTOR DEVICE"

To Be

-- SEMICONDUCTOR DEVICE --

Signed and Sealed this
Twelfth Day of May, 2015

Michelle K. Lee
*Director of the United States Patent and Trademark Office*